US012794481B2

(12) United States Patent
Chen et al.

(10) Patent No.: US 12,794,481 B2
(45) Date of Patent: Nov. 10, 2026

(54) OSCILLATION SIGNAL GENERATING CIRCUIT AND OSCILLATION SIGNAL GENERATING METHOD

(71) Applicant: RichWave Technology Corp., Taipei (TW)

(72) Inventors: Pin-Cheng Chen, Taipei (TW); Tai-Cheng Lee, Taipei (TW); Tse-Peng Chen, Taipei (TW); Ming-Hung Wang, Taipei (TW)

(73) Assignee: RichWave Technology Corp., Taipei (TW)

( * ) Notice: Subject to any disclaimer, the term of this patent is extended or adjusted under 35 U.S.C. 154(b) by 14 days.

(21) Appl. No.: 19/007,550

(22) Filed: Jan. 2, 2025

(65) Prior Publication Data

US 2026/0095187 A1 Apr. 2, 2026

Related U.S. Application Data

(60) Provisional application No. 63/701,473, filed on Sep. 30, 2024.

(30) Foreign Application Priority Data

Dec. 19, 2024 (TW) ................................ 113149675

(51) Int. Cl.
*H03L 7/10* (2006.01)
*H03L 7/093* (2006.01)
*H03L 7/099* (2006.01)

(52) U.S. Cl.
CPC ................ *H03L 7/10* (2013.01); *H03L 7/093* (2013.01); *H03L 7/099* (2013.01)

(58) Field of Classification Search
CPC ............ H03L 7/10; H03L 7/093; H03L 7/099
USPC .......................................................... 331/1 R
See application file for complete search history.

(56) References Cited

U.S. PATENT DOCUMENTS 9,608,644 B1 * 3/2017 Raj ........................ H03L 7/091

FOREIGN PATENT DOCUMENTS

CN 104956591 A 9/2015

OTHER PUBLICATIONS

"Office Action of Taiwan counterpart Application", issued on Aug. 20, 2025, p. 1-p. 6.

* cited by examiner

*Primary Examiner* — Richard Tan
(74) *Attorney, Agent, or Firm* — JCIPRNET

(57) ABSTRACT

An oscillation signal generating circuit and an oscillation signal generating method are provided. The oscillation signal generating circuit includes a first circuit and a second circuit. The first circuit is configured to generate an output signal according to a reference clock signal and a feedback clock signal. The first circuit includes a voltage-controlled oscillator (VCO). The VCO is configured to output the output signal, and a frequency of the output signal is controlled by a control voltage. The second circuit includes a voltage compensation circuit and a maximum phase difference detector. When a maximum phase difference is detected by the maximum phase difference detector, the maximum phase difference detector controls the voltage compensation circuit to compensate the control voltage to a target voltage.

20 Claims, 8 Drawing Sheets

OSCILLATION SIGNAL GENERATING CIRCUIT AND OSCILLATION SIGNAL GENERATING METHOD

CROSS-REFERENCE TO RELATED APPLICATION

This application claims the priority benefit of U.S. Provisional Application No. 63/701,473, filed on Sep. 30, 2024 and Taiwan Application No. 113149675, filed on Dec. 19, 2024. The entirety of each of the above-mentioned patent applications is hereby incorporated by reference herein and made a part of this specification.

BACKGROUND

Technical Field

The disclosure relates to an oscillation signal generating circuit and an oscillation signal generating method, and in particular to an oscillation signal generating circuit and an oscillation signal generating method which may lock fast.

Related Art

For a radar sensor based on a stepped-frequency continuous wave (SFCW), the time to complete signal transmission across the entire operating frequency range is limited. To ensure accurate extraction of target information, a phase-locked loop circuit which may complete fast-locking operation becomes a key requirement.

To solve the aforementioned problem, it is common to design an increase in the operating bandwidth of the phase-locked loop circuit in the related art. However, the technical solution of achieving fast-locking operation by increasing the operating bandwidth of the phase-locked loop circuit may result in excessive phase noise in the signal. Therefore, balancing locking rate and noise performance is an important issue for those skilled in the art.

SUMMARY

The disclosure provides an oscillation signal generating circuit and an oscillation signal generating method which may complete frequency and/or phase locking operations of an output signal fast.

An oscillation signal generating circuit of the disclosure includes a first circuit and a second circuit. The first circuit is configured to generate an output signal according to a reference clock signal and a feedback clock signal. The first circuit includes a voltage-controlled oscillator. The voltage-controlled oscillator is configured to output the output signal, and a frequency of the output signal is controlled by a control voltage. The second circuit is coupled to the first circuit. The second circuit includes a voltage compensation circuit and a maximum phase difference detector. The maximum phase difference detector is coupled to the voltage compensation circuit. When the maximum phase difference detector detects a maximum phase difference, the maximum phase difference detector controls the voltage compensation circuit to compensate the control voltage to a target voltage.

The oscillation signal generating method of the disclosure includes following steps. An output signal is generated according to a reference clock signal and a feedback clock signal. A voltage-controlled oscillator is controlled to control a frequency of the output signal according to a control voltage and is outputted the output signal. A maximum phase difference is detected. When the maximum phase difference is detected, the control voltage is compensated to a target voltage.

Based on the above, the oscillation signal generating circuit of the disclosure detects the maximum phase difference by the maximum phase difference detector, and compensates the control voltage which controls the voltage-controlled oscillator to a target value when the maximum phase difference is detected. Thereby, the oscillation signal generating circuit may complete the frequency and/or phase locking operation of the output signal fast, improving the operating efficiency of the oscillation signal generating circuit.

DESCRIPTION OF THE EMBODIMENTS

Figure 1:
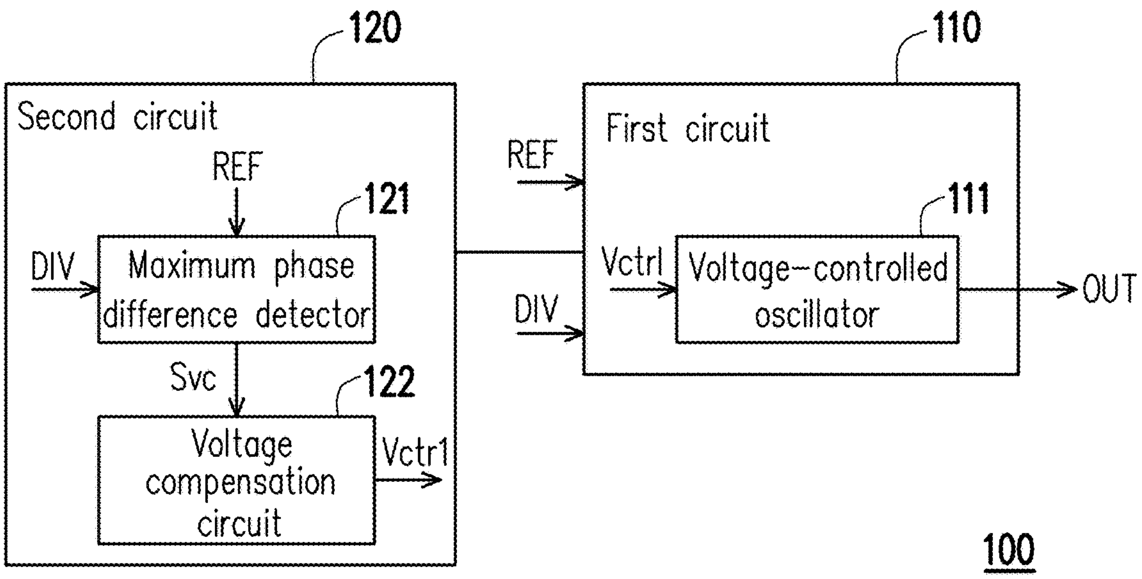
FIG. 1 is a schematic diagram of an oscillation signal generating circuit according to an embodiment of the disclosure.

Referring to FIG. 1, FIG. 1 is a schematic diagram of an oscillation signal generating circuit according to an embodiment of the disclosure. An oscillation signal generating circuit 100 includes a first circuit 110 and a second circuit 120. The first circuit 110 and the second circuit 120 are coupled to each other. The first circuit 110 generates an output signal OUT according to a reference clock signal REF and a feedback clock signal DIV. The first circuit 110 includes a voltage-controlled oscillator 111. The voltage-controlled oscillator 111 receives a control voltage Vctrl and generates the output signal OUT according to the control voltage Vctrl. The voltage-controlled oscillator 111 may control a frequency of the output signal OUT according to a voltage value of the control voltage Vctrl. In this embodiment, the feedback clock signal DIV may be generated by dividing the frequency of the output signal OUT. In some embodiments of the disclosure, the feedback clock signal DIV may also be generated by directly feeding back the output signal OUT. In an embodiment, the oscillation signal generating circuit 100 may be used in a radar sensor based on a stepped-frequency continuous wave (SFCW), the waveform of the output signal OUT may include stepped-frequency continuous wave, and a target frequency of the output signal OUT may be a lock frequency. The radar sensor may further includes a transmitting circuit, a receiving circuit, and antennas. The transmitting circuit/receiving circuit may transmit/receive wireless signal through the antennas to detect spatial information of an external object according to the output signal OUT generated by the oscillation signal generating circuit 100 respectively.

The second circuit 120 includes a maximum phase difference detector 121 and a voltage compensation circuit 122. The maximum phase difference detector 121 is coupled to the voltage compensation circuit 122. The maximum phase difference detector 121 may receive the feedback clock signal DIV and the reference clock signal REF, and perform a maximum phase difference detection operation according to the feedback clock signal DIV and the reference clock signal REF. The maximum phase difference detector 121 performs the maximum phase difference detection operation by detecting whether the phase difference between the feedback clock signal DIV and the reference clock signal REF is at a maximum value. For example, the maximum phase difference detector 121 may use multiple phase differences measured between the feedback clock signal DIV and the reference clock signal REF corresponding to multiple periods to form multiple discrete signals, which are then processed to obtain the aforementioned maximum phase difference. Further operational description may refer to the subsequent description accompanying FIG. 5A to FIG. 5C. When the maximum phase difference is detected, the maximum phase difference detector 121 controls the voltage compensation circuit 122 to compensate the control voltage Vctrl to a target voltage. Furthermore, the maximum phase difference detector 121 may correspondingly generate a voltage compensation signal Svc, and may control the voltage compensation circuit 122 by providing the voltage compensation signal Svc to the voltage compensation circuit 122. The voltage compensation signal Svc may be considered as a signal to activate the voltage compensation circuit 122, causing the voltage compensation circuit 122 to provide the control voltage Vctrl. At this time, the control voltage Vctrl is compensated to the target voltage.

In this embodiment, when the maximum phase difference detector 121 detects the aforementioned maximum phase difference, the frequency of the output signal OUT initially reaching a target lock frequency may be determined. Therefore, when the maximum phase difference is detected by the maximum phase difference detector 121, the oscillation signal generating circuit 100 according to the embodiment of the disclosure may quickly complete a frequency locking operation of the output signal OUT by directly compensating the control voltage Vctrl to the target voltage.

Figure 2:
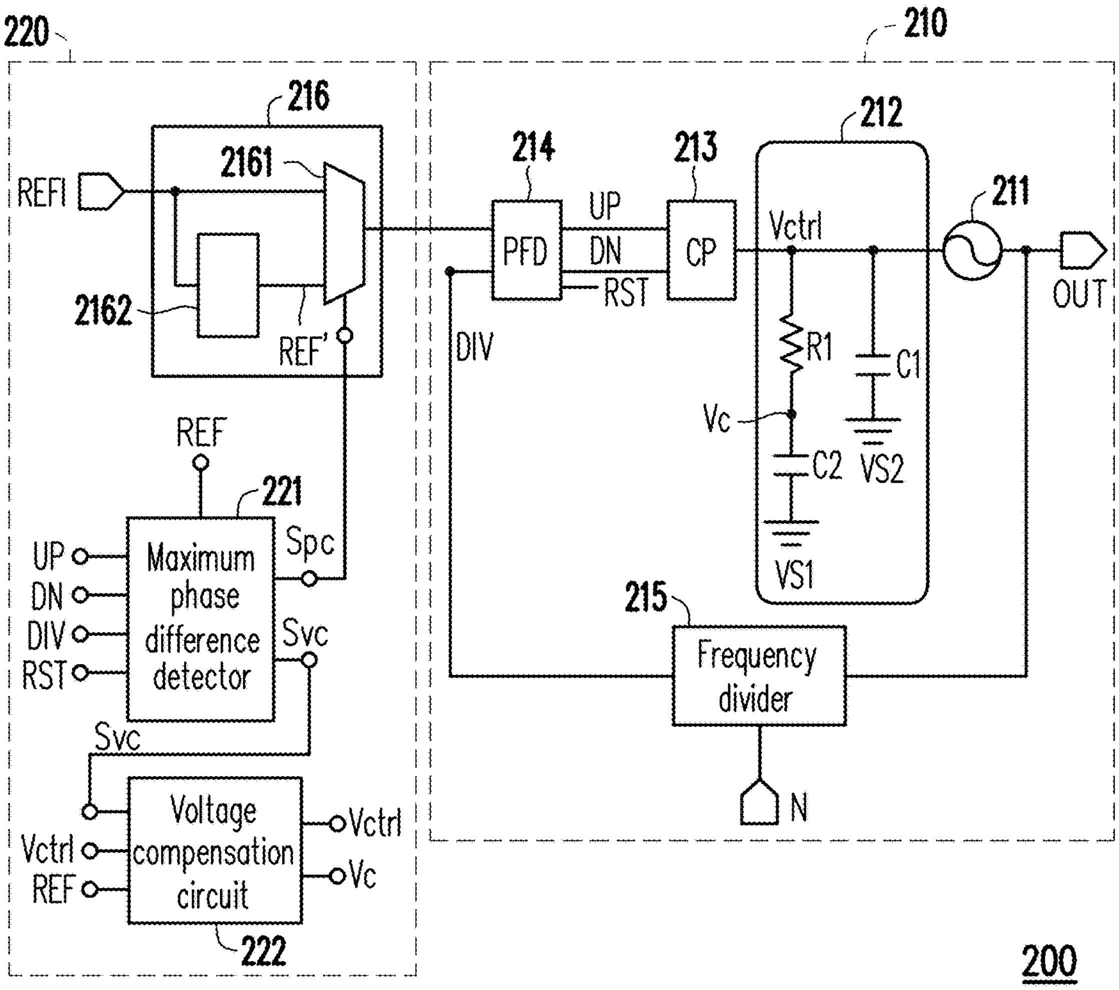
FIG. 2 is a schematic diagram of an oscillation signal generating circuit according to another embodiment of the disclosure.

Referring to FIG. 2, FIG. 2 is a schematic diagram of an oscillation signal generating circuit according to another embodiment of the disclosure. An oscillation signal generating circuit 200 includes a first circuit 210 and a second circuit 220 coupled to each other. The first circuit 210 includes a voltage-controlled oscillator 211, a loop filter 212, a charge pump (CP) 213, a phase frequency detector (PFD) 214, and a frequency divider 215. The voltage-controlled oscillator 211, the loop filter 212, the charge pump 213, the phase frequency detector 214, and the frequency divider 215 form a phase lock loop (PLL) circuit. The voltage-controlled oscillator 211 may generate a periodic output signal OUT according to the control voltage Vctrl on the loop filter 212. The frequency divider 215 is coupled between the voltage-controlled oscillator 211 and the phase frequency detector 214. The frequency divider 215 may perform a frequency division operation with a divisor N on the frequency of the output signal OUT, thereby generating a feedback clock signal DIV.

The phase frequency detector 214 is coupled to the voltage-controlled oscillator 211 and is configured to receive the reference clock signals REF or REF' and the feedback clock signal DIV. By detecting the frequency and phase differences between the reference clock signals REF or REF' and the feedback clock signal DIV, the phase frequency detector 214 generates signals UP and DN. The signals UP and DN are configured to indicate leading or lagging information of the frequency between the detected reference clock signals (REF or REF') and the feedback clock signal DIV. The phase frequency detector 214 also receives a reset signal RST and resets a phase frequency detection operation according to the reset signal RST. The charge pump 213 is coupled to the voltage-controlled oscillator 211 and is configured to receive signals UP and DN. Under a normal circumstance, for example, when the maximum phase difference detector 221 has not detected a maximum phase difference, the charge pump 213 executes up/down operations of a charge pump according to the signals UP and DN to generate the control voltage Vctrl, and thereby control the frequency and phase of the output signal OUT by adjusting the voltage value of the control voltage Vctrl.

The loop filter 212 is coupled to the voltage-controlled oscillator 211 and the voltage compensation circuit 222. An input end of the loop filter 212 has a control voltage Vctrl. The loop filter 212 includes capacitors C1 and C2 and a resistor R1. The capacitor C2 and the resistor R1 are coupled in series between the control voltage Vctrl and the reference voltage VS1. The capacitor C1 is coupled between the control voltage Vctrl and the reference voltage VS2. The mutually coupled ends of the capacitor C2 and the resistor R1 also receive a capacitance voltage Vc. In this embodiment, the reference voltages VS1 and VS2 may be the same or different. The loop filter 212 of this embodiment may be a low-pass filter.

The second circuit 220 includes a maximum phase difference detector 221, a phase compensation circuit 216, and a voltage compensation circuit 222. The maximum phase difference detector 221 receives the signals UP and DN, the feedback clock signal DIV, the reference clock signal REF, and the reset signal RST. The maximum phase difference detector 221 may detect whether a maximum phase difference occurs between the feedback clock signal DIV and the reference clock signal REF according to on the signals UP and DN, the feedback clock signal DIV, and the reference clock signal REF, and accordingly generate a voltage compensation signal Svc and a phase compensation signal Spc. It should be noted that the reset signal RST, in addition to controlling a reset operation of the phase frequency detector 214 as mentioned earlier, is also provided to the maximum phase difference detector 221 as an operation timing reference clock for a comparator of the maximum phase difference detector 221, which is described later in conjunction with FIG. 6.

In this embodiment, the phase compensation circuit 216 includes a switching circuit 2161 and a phase adjuster 2162. The phase compensation circuit 216 is coupled to the phase frequency detector 214 and the maximum phase difference detector 221, and the phase compensation circuit 216 is coupled between a reference signal input end REFI and the phase frequency detector 214. The reference clock signal REF comes from the reference signal input end REFI. The phase compensation circuit 216 may receive the reference clock signal REF and provide either the reference clock signal REF or the phase-adjusted reference clock signal REF' to the phase frequency detector 214. Furthermore, the phase compensation circuit 216 is configured to adjust the reference clock signal REF. Specifically, the phase adjuster 2162 of the phase compensation circuit 216 is configured to adjust the phase of the reference clock signal REF to generate the reference clock signal REF'. The switching circuit 2161 receives the phase compensation signal Spc and determines whether to output the reference clock signals REF or REF' to the phase frequency detector 214 according to the phase compensation signal Spc. Before the aforementioned maximum phase is detected, the switching circuit 2161 may output the reference clock signal REF to the phase frequency detector 214. When the aforementioned maximum phase is detected, the switching circuit 2161 may output the reference clock signal REF' to the phase frequency detector 214. In other words, when the maximum phase difference detector 221 detects the maximum phase difference, the phase compensation circuit 216 compensates the phase of the reference clock signal REF to form the phase-adjusted reference clock signal REF', and thereby make the phase of the reference clock signal REF' and the phase of the feedback clock signal DIV tend to be consistent to complete the phase compensation operation.

Furthermore, when the maximum phase difference is detected, the maximum phase difference detector 221 may generate a corresponding phase compensation signal Spc to make the phase compensation circuit 216 output the adjusted reference clock signal REF' to the phase frequency detector 214. The reference clock signal REF' is generated by offsetting the reference clock signal REF by a phase compensation amount, and is configured to make the phase of the reference clock signal REF' and the phase of the feedback clock signal DIV tend to be consistent. The phase compensation amount may be in a form of a signal waveform period, for example, 0.1 signal waveform period, 0.3 signal waveform period, or 0.5 signal waveform period. The phase compensation amount may be recorded in a lookup table, which may be disposed in the phase adjuster 2162 in a form of a memory or a register. In this embodiment, the phase adjuster 2162 may delay the phase of the reference clock signal REF to generate the reference clock signal REF'. In other embodiments, the phase adjuster 2162 may also advance the phase of the reference clock signal REF to generate the reference clock signal REF'.

The voltage compensation circuit 222 receives the voltage compensation signal Svc, the control voltage Vctrl, and the reference clock signal REF. The voltage compensation circuit 222 may generate a target voltage according to the control voltage Vctrl and provide the target voltage to generate a new control voltage Vctrl, thereby completing the voltage compensation operation. Furthermore, when the maximum phase difference detector 221 detects the maximum phase difference, the maximum phase difference detector 221 outputs the voltage compensation signal Svc to the voltage compensation circuit 222. The voltage compensation circuit 222 compensates the control voltage Vctrl to the target voltage and provides the control voltage Vctrl to the loop filter 212. At this time, a loop between the charge pump 213 and the loop filter 212 is temporarily disconnected. Specifically, when the maximum phase difference is detected, the voltage compensation circuit 222 may calculate sample voltages corresponding to multiple sampling time points of the control voltage Vctrl according to the voltage compensation signal Svc, and calculate an average value of these sample voltages to generate the target voltage. The voltage compensation circuit 222 may generate the aforementioned sampling time points according to the reference clock signal REF. Next, the voltage compensation circuit 222 may output the obtained target voltage through a voltage buffer to serve as a new control voltage Vctrl and capacitance voltage Vc for the loop filter 212, thereby enhancing the locking operation of the output signal OUT. In another embodiment, a normally closed bypass switch (not shown in the figure) may be connected in parallel with the resistor R1. When the voltage compensation circuit 222 outputs the new control voltage Vctrl, the bypass switch may be briefly turned on, for example, under the control of the maximum phase difference detector 221, which makes the capacitance voltage Vc equalize with the new control voltage Vctrl more rapidly. In this architecture, the voltage compensation circuit 222 may transmit either the control voltage Vctrl or the capacitance voltage Vc to the loop filter 212 by an output end, thereby achieving voltage compensation operation.

In the above description, the generation of sample voltages and the calculation of average values may be implemented by using sample and hold (S/H) circuits and voltage average value generating circuits (for example, average voltage filters) well-known to those skilled in the art, without fixed restrictions.

Figure 3:
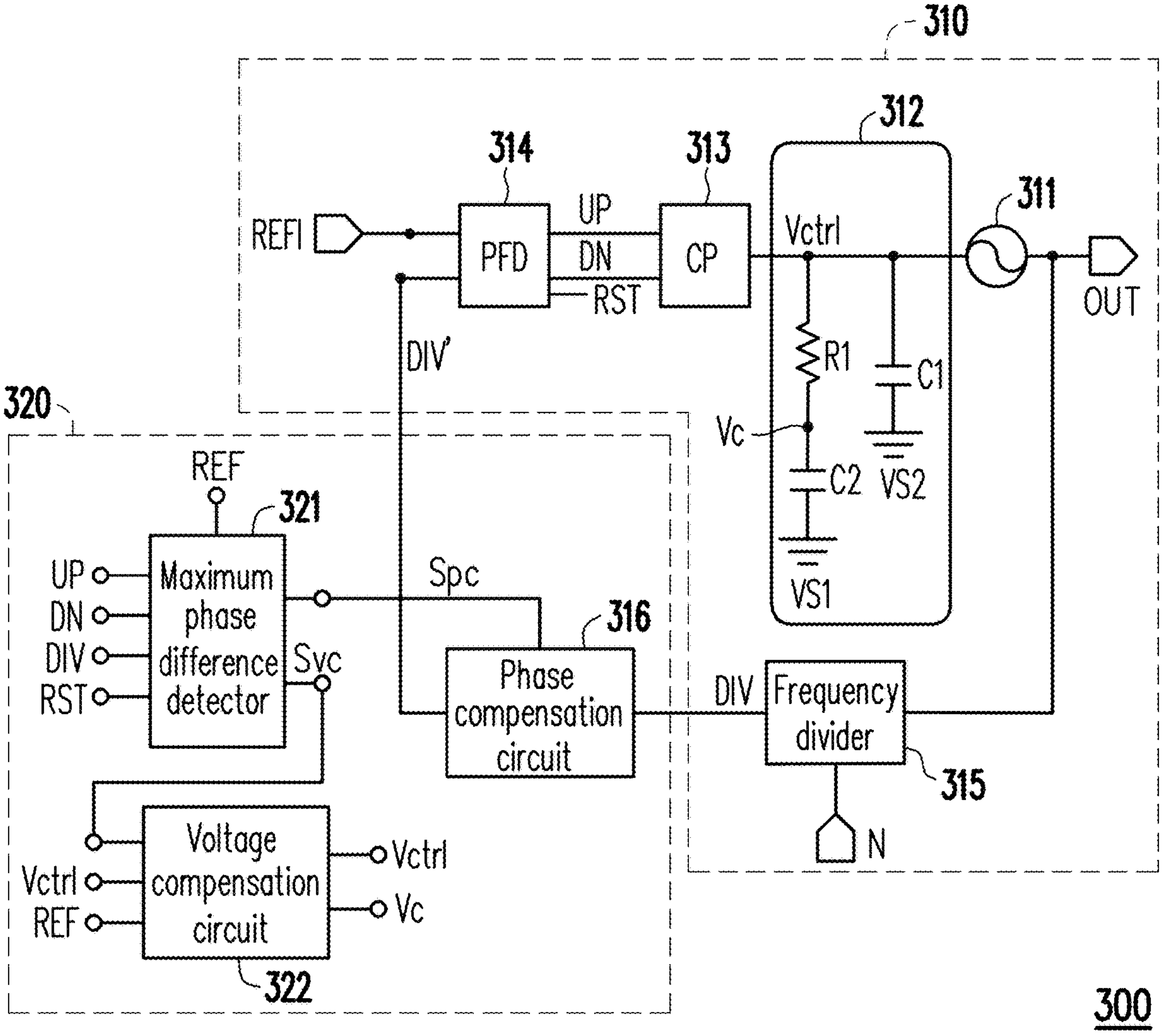
FIG. 3 is a schematic diagram of an oscillation signal generating circuit according to another embodiment of the disclosure.

Referring to FIG. 3 below, FIG. 3 is a schematic diagram of an oscillation signal generating circuit according to another embodiment of the disclosure. An oscillation signal generating circuit 300 includes a first circuit 310 and a second circuit 320 coupled to each other. The first circuit 310 includes a voltage-controlled oscillator 311, a loop filter 312, a charge pump 313, a phase frequency detector 314, and a frequency divider 315. The second circuit 320 includes a phase compensation circuit 316, a maximum phase difference detector 321, and a voltage compensation circuit 322.

Unlike the previously described embodiment of the oscillation signal generating circuit 200, the phase compensation circuit 316 in this embodiment is coupled in the feedback path from the frequency divider 315 to the phase frequency detector 314. In detail, the phase compensation circuit 316 is configured to perform a phase adjustment operation on the feedback clock signal DIV generated by the frequency divider 315, thereby generating an adjusted feedback clock signal DIV'. In this embodiment, the phase compensation circuit 316 may shift the phase of the feedback clock signal DIV by a phase compensation amount to generate the feedback clock signal DIV'. As mentioned above, the phase compensation amount may be in a form of a signal waveform period. Furthermore, when the maximum phase difference detector 321 detects the maximum phase difference, the phase compensation circuit 316 compensates the phase of the feedback clock signal DIV to form the phase-adjusted feedback clock signal DIV', and thereby makes the phase of the reference clock signal REF and the phase of the feedback clock signal DIV' tend to be consistent. In this embodiment, the phase compensation circuit 316 may advance the phase of the feedback clock signal DIV to generate the feedback clock signal DIV'. In other embodiments, the phase compensation circuit 316 may also delay the phase of the feedback clock signal DIV to generate the feedback clock signal DIV'.

Furthermore, the phase compensation circuit 316 may determine the phase compensation amount of the feedback clock signal DIV by an interpolation element.

Incidentally, in the oscillation signal generating circuit 300 of this embodiment and the oscillation signal generating circuit 200 of the previous embodiment, the voltage-controlled oscillators 311 and 211, the loop filters 312 and 212, the charge pumps 313 and 213, the phase frequency detectors 314 and 214, and the frequency dividers 315 and 215 may all be implemented by using relevant circuit architectures well-known to those skilled in the art, without specific restrictions.

Moreover, the maximum phase difference detector 321 and the voltage compensation circuit 322 in this embodiment may have the same circuit architecture and operation method as the maximum phase difference detector 221 and the voltage compensation circuit 222 in the embodiment of FIG. 2, respectively, which is not repeated here.

Figure 4A:
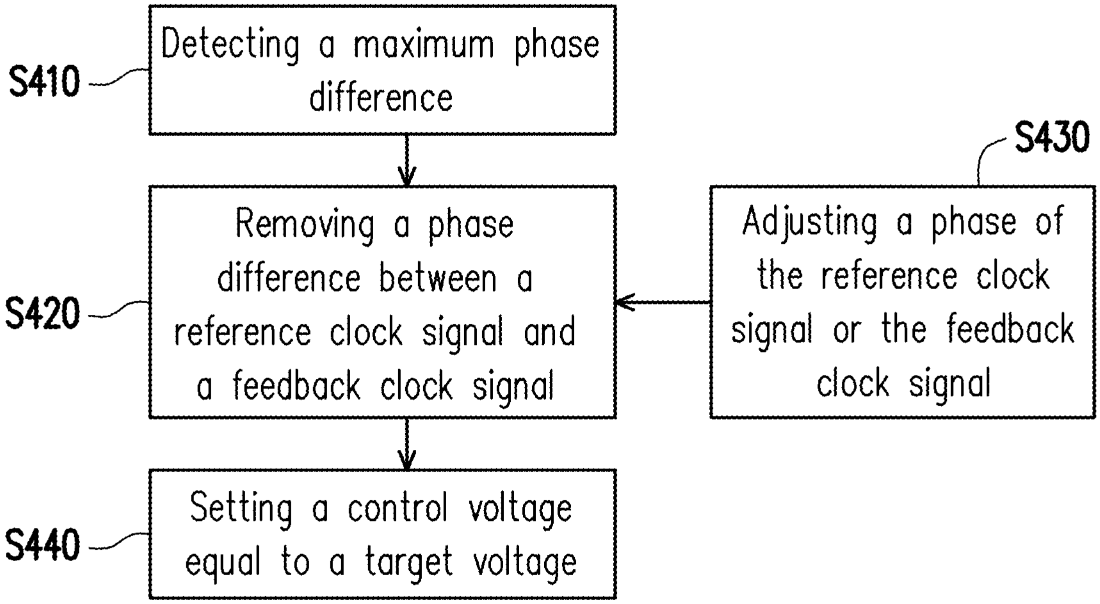
FIG. 4A is an operation flow chart of an oscillation signal generating circuit according to an embodiment of the disclosure.
Figure 4B:
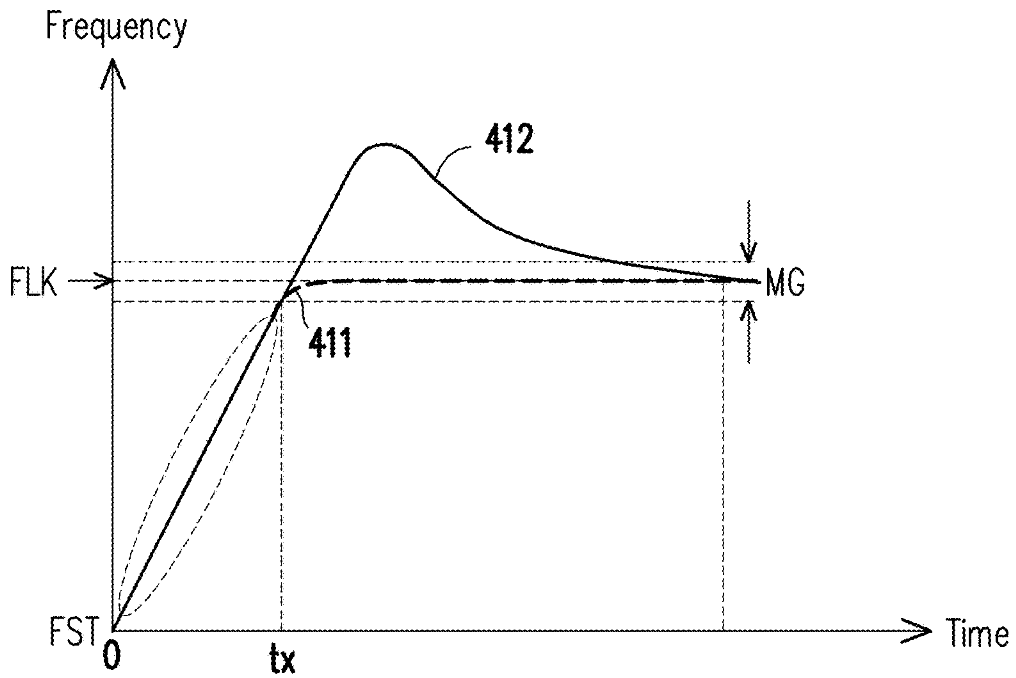
FIG. 4B to FIG. 4D are waveform schematic diagrams of operation processes of oscillation signal generating circuits according to embodiments of the disclosure.
Figure 4C:
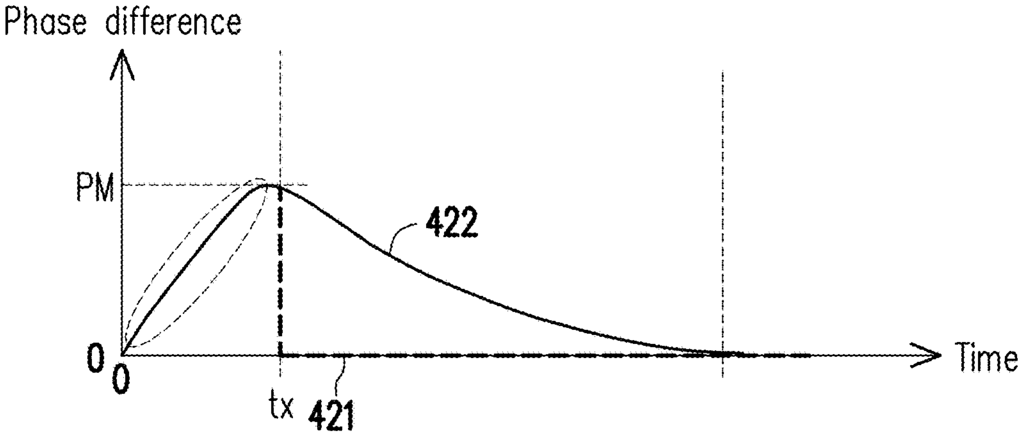
Figure 4D:
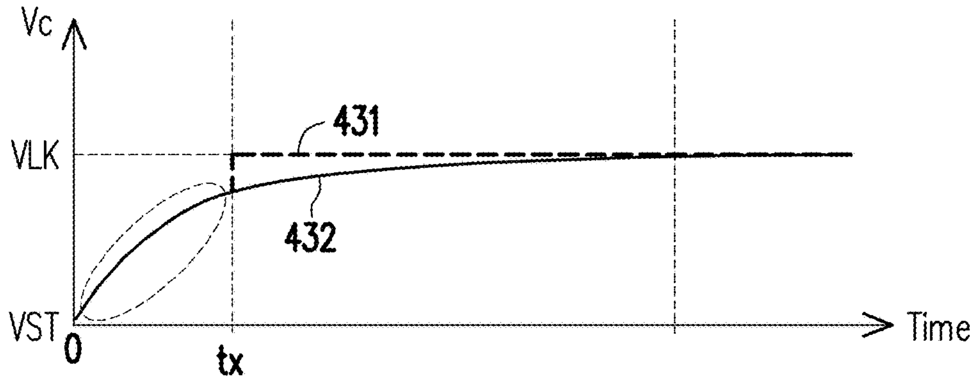

Referring to FIG. 4A and FIG. 4B to FIG. 4D, FIG. 4A is an operation flow chart of an oscillation signal generating circuit according to an embodiment of the disclosure, and FIG. 4B to FIG. 4D are waveform schematic diagrams of operation processes of oscillation signal generating circuits according to embodiments of the disclosure. FIG. 4B shows a relationship between the frequency of the output signal and time. FIG. 4C shows a relationship between the phase difference between the corresponding reference clock signal REF and the feedback clock signal DIV and time. FIG. 4D shows a relationship between the capacitance voltage Vc and time.

In FIG. 4A, in step S410, the maximum phase difference detector of the oscillation signal generating circuit may execute the maximum phase difference detection operation, and proceed to step S420 when the maximum phase difference is detected. In FIG. 4B, a curve 412 represents a frequency variation curve of the output signal of the oscillation signal generating circuit without applying the embodiment of the disclosure, while a curve 411 represents a frequency variation curve of the output signal of the oscillation signal generating circuit of the embodiment of the disclosure. Between a time point 0 and a time point tx, in both curves 411 and 412, the frequency of the output signal may rise from a starting frequency FST to a lock frequency FLK, and enter a lock interval MG.

In FIG. 4C, the curve 422 represents the phase difference variation curve between the corresponding reference clock signal REF and the feedback clock signal DIV of the oscillation signal generating circuit without applying the embodiment of the disclosure, while the curve 421 represents the phase difference variation curve between the corresponding feedback clock signal DIV and the reference clock signal REF of the oscillation signal generating circuit of the embodiment of the disclosure. Between the time point 0 and the time point tx, in both curves 421 and 422, the phase difference between the corresponding reference clock signal REF and the feedback clock signal DIV may rise from the initial phase difference 0 to the maximum phase difference PM.

In FIG. 4D, a curve 432 represents a variation curve of the capacitance voltage Vc of the oscillation signal generating circuit without applying the embodiment of the disclosure, while a curve 431 represents a variation curve of the capacitance voltage Vc of the oscillation signal generating circuit of the embodiment of the disclosure. Between a time point 0 and a time point tx, in both curves 431 and 432, the capacitance voltage Vc may rise from a starting voltage VST to a voltage value lower than a target voltage VLK.

Next, in step S420, the oscillation signal generating circuit is configured to remove the phase difference between the reference clock signal and the feedback clock signal. Step S420 may be executed in conjunction with step S430. In step S430, the phase compensation circuit in the oscillation signal generating circuit may adjust the phase of the reference clock signal or the feedback clock signal to remove the phase difference between the reference clock signal and the feedback clock signal. Furthermore, in step S440, the oscillation signal generating circuit sets the control voltage equal to the target voltage. In this embodiment, "removing the phase difference" may not be "completely removing the phase difference". "Removing the phase difference" may be "removing the phase difference to the level within allowable error range", for example, "removing the phase difference to the level within 10% of original phase difference".

Corresponding to FIG. 4B to FIG. 4D, in FIG. 4C, in the curve 421, the phase difference between the reference clock signal and the feedback clock signal is removed at the time point tx, that is, the phase difference between the reference clock signal and the feedback clock signal is reduced, for example, reduced to 0, at the time point tx. In FIG. 4D, at the time point tx, in the curve 431, the capacitance voltage Vc is directly set equal to the target voltage VLK, that is, the capacitance voltage Vc is raised to the target voltage VLK at the time point tx. Correspondingly, in FIG. 4B, in the curve 411, the frequency of the output signal may be quickly locked in the locking interval MG corresponding to the locking frequency FLK at the time point tx.

Figure 5A:
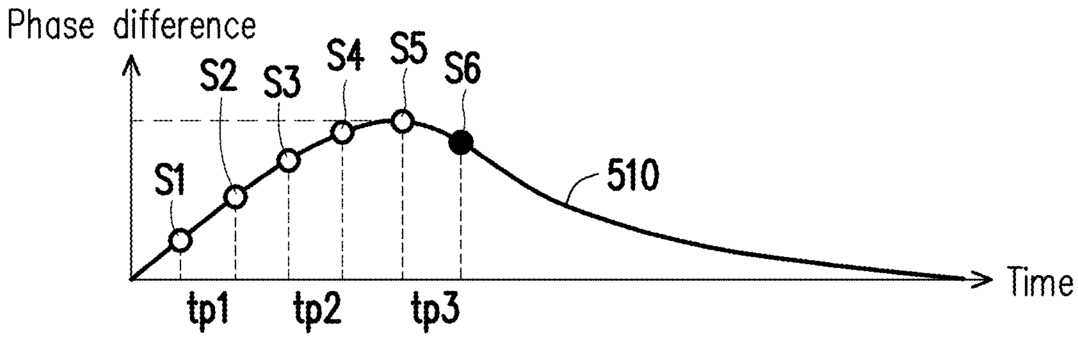
FIG. 5A to FIG. 5C are schematic diagrams of maximum phase difference detection operations according to embodiments of the disclosure.
Figure 5B:
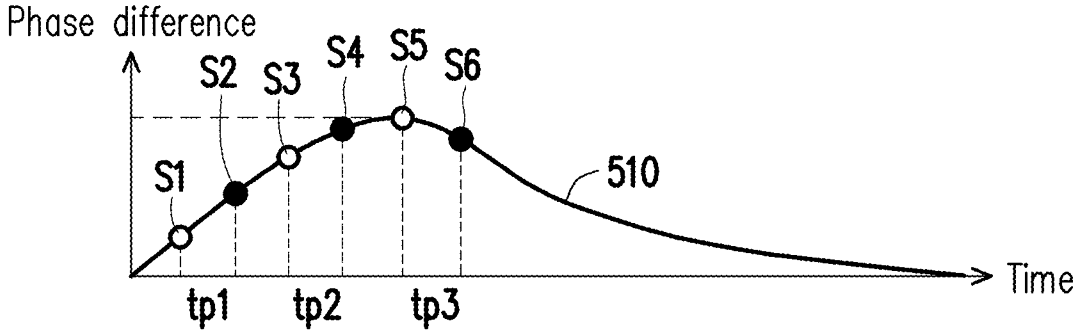
Figure 5C:
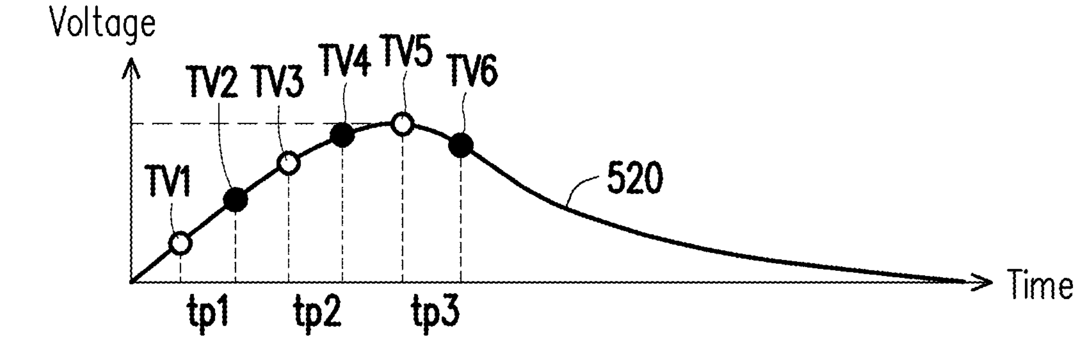

Regarding the operational details of the maximum phase difference detector according to the embodiment of the disclosure, please refer to FIG. 5A to FIG. 5C, which are schematic diagrams of maximum phase difference detection operations according to embodiments of the disclosure. FIG. 5A to FIG. 5C show multiple steps of the maximum phase difference detection operation. In FIG. 5A, a curve 510 represents a variation curve of the phase difference. In the first step, the maximum phase difference detector may set multiple sample points on the phase curve 510 and generate respective phase differences for multiple sample points S1 to S6.

Next, in the second step, as shown in FIG. 5B, the maximum phase difference detector may divide the sample points S1 to S6 into multiple odd sample points S1, S3, and S5 and multiple even sample points S2, S4, and S6.

In the third step, as shown in FIG. 5C, the maximum phase difference detector may perform a time-domain voltage conversion operation corresponding to the phase differences of the sample points S1 to S6, and obtain voltages TV1 to TV6 distributed on the curve 520, respectively corresponding to multiple sample points S1 to S6. The voltages TV1, TV3, and TV5 are odd voltages, and the voltages TV2, TV4, and TV6 are even voltages.

Furthermore, the maximum phase difference detector may compare the voltages TV1, TV3, and TV5 with the voltages TV2, TV4, and TV6 respectively, and thereby calculate a variation trend from the voltage TV1 to the voltage V6, which is a positive or negative polarity of a variation slope. In this embodiment, the variation slope has a positive polarity during a time interval tp1 between the voltage TV1 and the voltage TV2, the variation slope has a positive polarity during a time interval tp2 between the voltage TV3 and the voltage TV4, and the variation slope changes to a negative polarity during a time interval tp3 between voltage TV5 and voltage TV6.

Through a state where the variation slope changes from the positive polarity to the negative polarity, the maximum phase difference detector may recognize that the phenomenon of maximum phase difference occurs between the time intervals tp2 and tp3. In other words, when the magnitude variation trend of the first two of voltages TV1 to TV6 is opposite to the magnitude variation trend of the subsequent two of voltages TV1 to TV6, the maximum phase difference detector detecting the maximum phase difference is determined.

Figure 6:
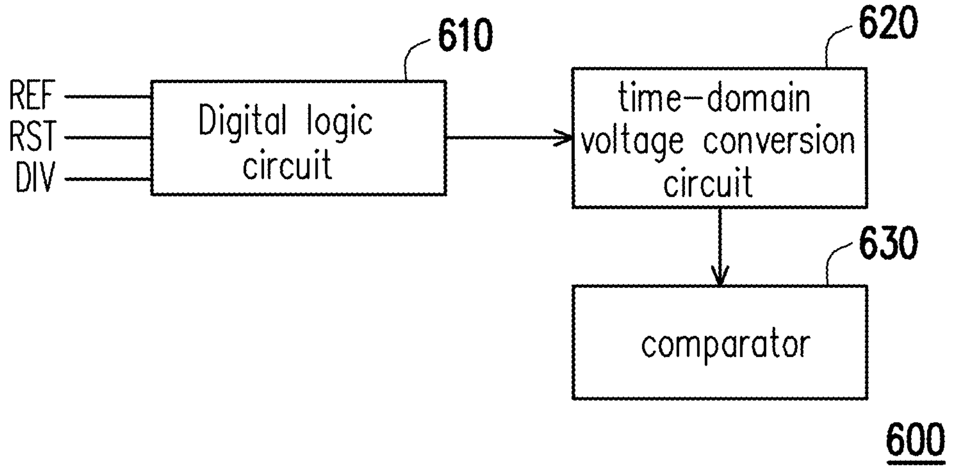
FIG. 6 is a schematic diagram of an implementation manner of a maximum phase difference detector according to an embodiment of the disclosure.

It is worth noting that, the detailed description of the maximum phase difference detector may simultaneously refer to FIG. 6, which is a schematic diagram of an implementation manner of a maximum phase difference detector according to an embodiment of the disclosure. A maximum phase difference detector 600 includes a digital logic circuit 610, a time-domain voltage conversion circuit 620, and a comparator 630. The digital logic circuit 610 may sequentially record phase differences at least at four time points according to the reference clock signal REF and the feedback clock signal DIV. In this embodiment, for example, phase differences at six time points are recorded, phase differences of the sample points S1 to S6 are generated, and then by the sample points S1 to S6 are divided into multiple odd sample points S1, S3, and S5 and the even sample points S2, S4, and S6 by the digital logic circuit 610. The time-domain voltage conversion circuit 620 may be configured to obtain the voltages TV1, TV3, and TV5 corresponding to each odd sample point S1, S3, and S5, and obtain the voltages TV2, TV4, and TV6 corresponding to each even sample point S2, S4, and S6.

The comparator 630 may be configured to sequentially compare the voltage TV1 with the voltage TV2, compare the voltage TV3 with the voltage TV4, and then compare the voltage TV5 with the voltage TV6, to generate multiple variation slopes respectively. Furthermore, the comparator 630 may receive a reset signal RST, and may control the timing of executing the aforementioned comparison operations by the reset signal RST. For example, when the phase frequency detector 214 resets a phase frequency detection operation according to the reset signal RST to obtain a new set of phase differences between the reference clock signal REF and the feedback clock signal DIV, the comparator 630 also correspondingly compares the voltages converted from the aforementioned phase differences according to the reset signal RST. In this embodiment, taking voltages TV1 and TV2 as an example, when the voltage TV1 is not greater than voltage TV2, the corresponding variation slope is positive, and when the voltage TV1 is greater than the voltage TV2, the corresponding variation slope is negative. The maximum phase difference detector may obtain the time interval where the maximum phase difference occurs by determining the state where the variation slope changes from the positive polarity to the negative polarity.

In the above description, the circuit architectures of the time-domain voltage conversion circuit 620 and the comparator 630 of the maximum phase difference detector 600 are well known to those skilled in the art, and therefore are not elaborated here. The digital logic circuit 610 may be obtained by applying digital circuit design methods (such as hardware description language or gate-level design) well known to those skilled in the art, without any particular limitations. Furthermore, the maximum phase difference detector 600 may be applied as the maximum phase difference detector 221 of the oscillation signal generating circuit 200 in FIG. 2 and the maximum phase difference detector 321 of the oscillation signal generating circuit 300 in FIG. 3.

Figure 7:
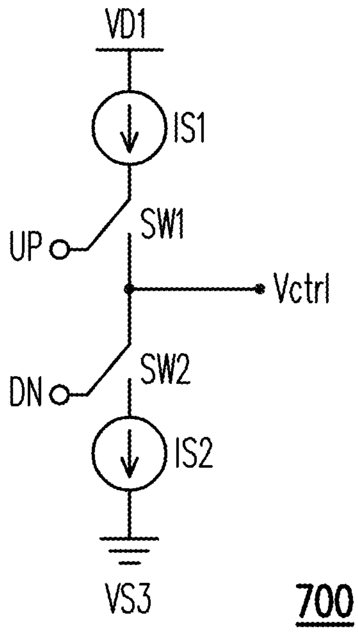
FIG. 7 is a schematic diagram of an implementation manner of a charge pump in an oscillation signal generating circuit according to an embodiment of the disclosure.

Referring to FIG. 7, FIG. 7 is a schematic diagram of an implementation manner of a charge pump in an oscillation signal generating circuit according to an embodiment of the disclosure. A charge pump 700 includes current sources IS1 and IS2 and switches SW1 and SW2. The current source IS1, the switches SW1 and SW2, and the current source IS2 are sequentially coupled between the reference voltage end VD1 and the reference voltage end VS3. The switches SW1 and SW2 are controlled by signals UP and DN respectively. The mutually coupled ends of the switches SW1 and SW2 provide the control voltage Vctrl.

The switch SW1 may be turned on or turned off according to the voltage level of the signal UP, and the switch SW2 may be turned on or turned off according to the voltage level of the signal DN. When the switch SW1 is turned on and the switch SW2 is turned off, the control voltage Vctrl may be pulled up. When the switch SW2 is turned on and the switch SW1 is turned off, the control voltage Vctrl may be pulled down. The charge pump 700 may be applied as the charge pump 213 of the oscillation signal generating circuit 200 in FIG. 2 and the charge pump 313 of the oscillation signal generating circuit 300 in FIG. 3. Referring to FIG. 7, FIG. 2, and FIG. 3 together, when the maximum phase difference detector 221/321 detects the maximum phase difference, the voltages of the signals UP and DN received by the charge pump 213/313/700 are both at a first voltage. The first voltage may be a voltage of 0 volt or a low voltage, making the switches SW1 and SW2 to be turned off simultaneously. When the phase compensation operation and voltage compensation operation are completed, the signals UP and DN return to pulse signals to dynamically adjust the control voltage Vctrl.

Figure 8:
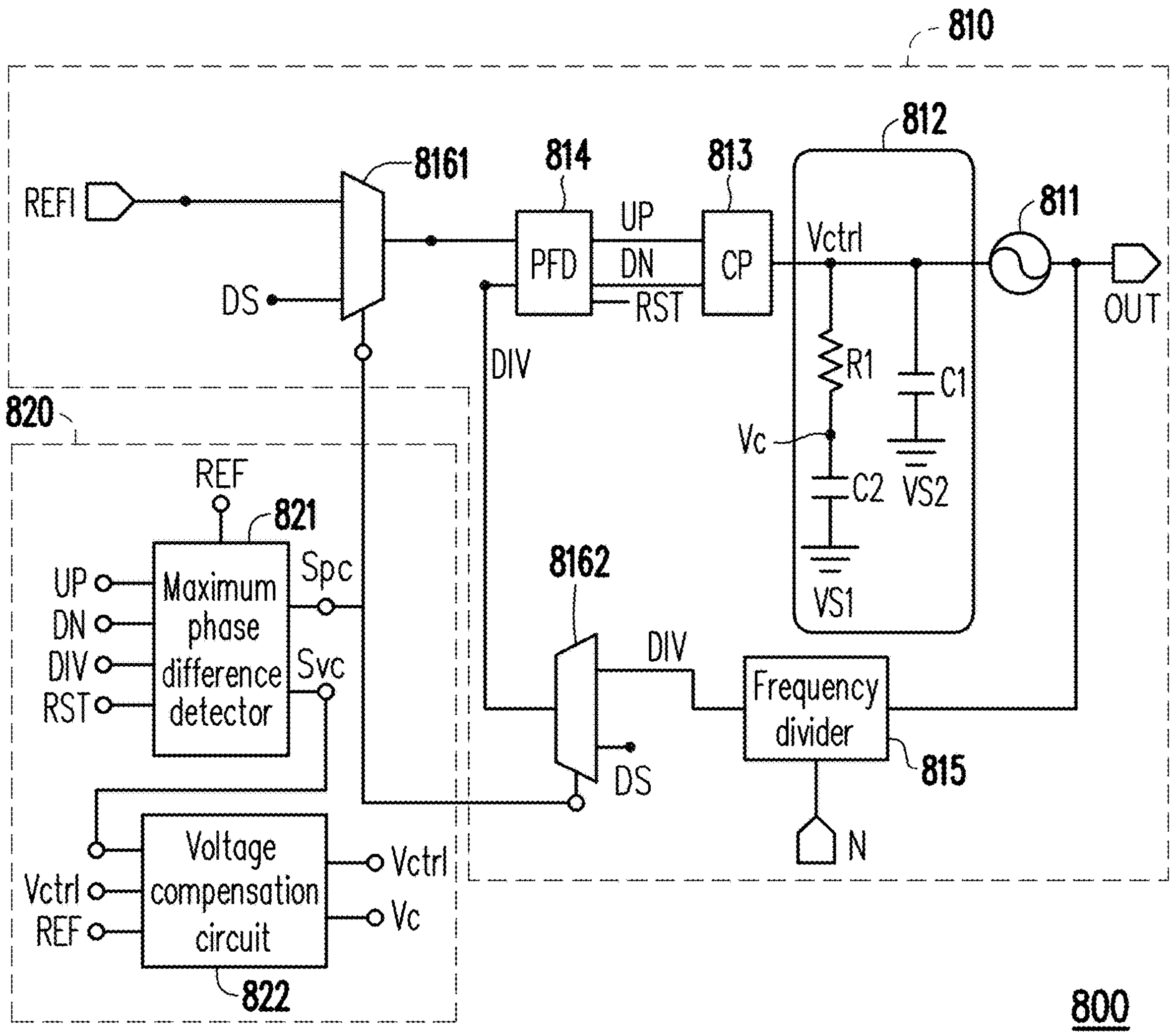
FIG. 8 is a schematic diagram of an oscillation signal generating circuit according to another embodiment of the disclosure.

Referring to FIG. 8 below, FIG. 8 is a schematic diagram of an oscillation signal generating circuit according to another embodiment of the disclosure. An oscillation signal generating circuit 800 includes a first circuit 810 and a second circuit 820 coupled to each other. The first circuit 810 includes a voltage-controlled oscillator 811, a loop filter 812, a charge pump 813, a phase frequency detector 814, and a frequency divider 815. The second circuit 820 includes a maximum phase difference detector 821 and a voltage compensation circuit 822.

Different from the embodiment of FIG. 2, the oscillation signal generating circuit 800 in FIG. 8 does not include a phase compensation circuit, and the first circuit 810 of the oscillation signal generating circuit 800 further includes a switching circuit 8161 and a switching circuit 8162. The phase frequency detector 814 is coupled to the voltage-controlled oscillator 811. The frequency divider 815 is coupled between the voltage-controlled oscillator 811 and the phase frequency detector 814. The switching circuit 8162 is coupled between the frequency divider 815, the phase frequency detector 814, and the maximum phase difference detector 821, that is, the switching circuit 8162 is coupled in a path where the frequency divider 815 feeds back to the phase frequency detector 814. The switching circuit 8161 is coupled to the phase frequency detector 814 and the maximum phase difference detector 821, that is, the switching circuit 8161 is coupled in a path where the phase frequency detector 814 receives the reference clock signal REF provided by the reference signal input end REFI. The switching circuit 8161 is configured to output a direct current signal DS to an input end of the phase frequency detector 814 when the maximum phase difference detector 821 detects the maximum phase difference. The switching circuit 8162 is configured to output the same direct current signal DS to another input end of the phase frequency detector 814 when the maximum phase difference detector 821 detects the maximum phase difference. The direct current signal DS may be a voltage of 0 volt, or the direct current signal DS may be a low voltage, to make the voltages of the signals UP and DN output by the phase frequency detector 814 be a voltage of 0 volt or a low voltage, thereby making an output end of the charge pump 813 to be high impedance, and a loop between the charge pump 813 and the loop filter 812 is turned off.

It should be noted that the oscillation signal generating circuit 800 in FIG. 8 only performs a frequency locking operation, and does not perform a phase locking operation. As a result, the oscillation signal generating circuit 800 only performs a voltage compensation operation, and does not perform a phase compensation operation. The charge pump 700 in FIG. 7 may also be applied to the charge pump 813 of the oscillation signal generating circuit 800 in FIG. 8, but the operation is not exactly the same as when applied to the charge pumps 213 and 313 in the embodiments of FIG. 2 and FIG. 3. Furthermore, referring to FIG. 7 and FIG. 8 together, under a normal circumstance, for example, when the maximum phase difference detector 821 does not detect the maximum phase difference, the voltage-controlled oscillator 811 changes the frequency of the output signal, and the charge pump 813 operates. At this time, the signals UP and DN received by the charge pump 813 are pulse signals, and the loop of the first circuit 810 is turned on. When the maximum phase difference detector 821 detects the maximum phase difference, the voltages of the signals UP and DN received by the charge pump 813 are both at a first voltage. This first voltage may be a voltage of 0 volt or a low voltage, making the switches SW1 and SW2 both turn off and a loop of the first circuit 810 turn off to achieve the frequency locking operation. At this time, the control voltage Vctrl is provided with a fixed voltage by the voltage compensation circuit 822, that is, the control voltage Vctrl is fixed.

Figure 9:
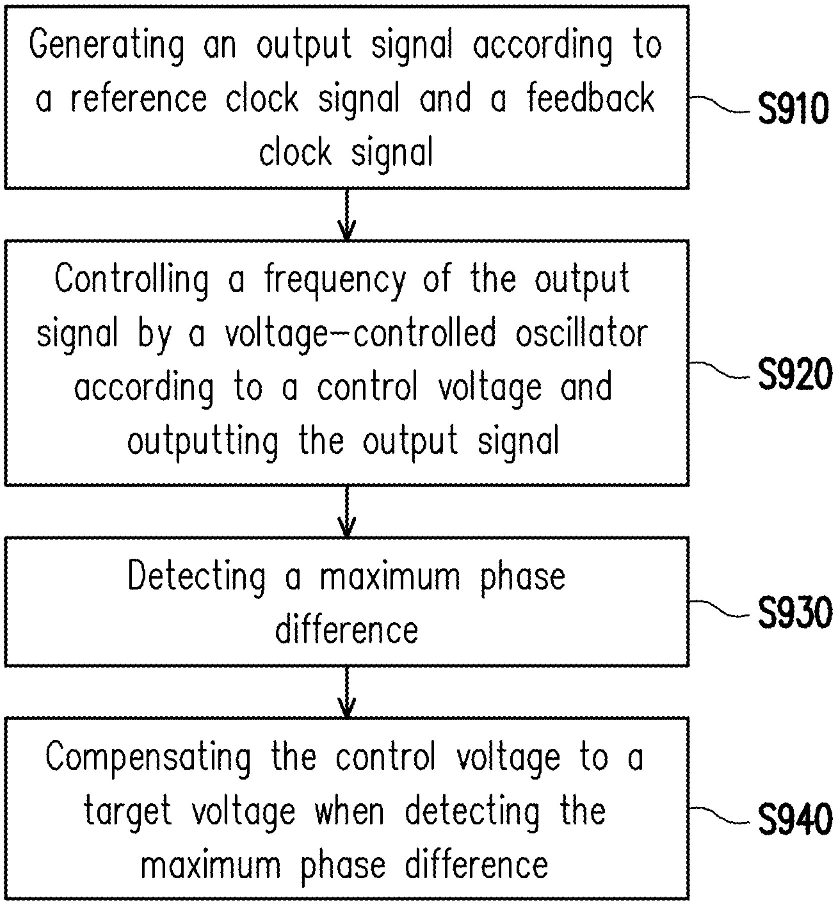
FIG. 9 is a flow chart of an oscillation signal generating method according to an embodiment of the disclosure.

Referring to FIG. 9, FIG. 9 is a flow chart of an oscillation signal generating method according to an embodiment of the disclosure. In step S910, the output signal may be generated according to the reference clock signal and the feedback clock signal. In step S920, the voltage-controlled oscillator may control the frequency of the output signal according to the control voltage and output the output signal. In step S930, the maximum phase difference is detected. In step S940, when the maximum phase difference is detected, the control voltage is compensated to a target voltage.

The implementation details of the above steps are provided in the aforementioned embodiments and implementation manners, and are not repeated here.

In summary, the oscillation signal generating circuit of the disclosure detects the occurrence state of the maximum phase difference by the maximum phase difference detector, and sets the control voltage of the voltage-controlled oscillator to the target voltage when the maximum phase difference occurs, so that the output signal generated by the oscillation signal generating circuit may complete fast-locking operation, thereby improving working efficiency.

What is claimed is:

1. An oscillation signal generating circuit, comprising:
- a first circuit, configured to generate an output signal according to a reference clock signal and a feedback clock signal, and comprising:
  - a voltage-controlled oscillator, configured to output the output signal, wherein a frequency of the output signal is controlled by a control voltage; and
- a second circuit, coupled to the first circuit, and comprising:
  - a voltage compensation circuit; and
  - a maximum phase difference detector, coupled to the voltage compensation circuit; wherein
- when the maximum phase difference detector detects a maximum phase difference, the maximum phase difference detector controls the voltage compensation circuit to compensate the control voltage to a target voltage.

2. The oscillation signal generating circuit according to claim 1, wherein when the maximum phase difference detector detects the maximum phase difference, the frequency of the output signal initially reaching a target lock frequency is determined.

3. The oscillation signal generating circuit according to claim 1, wherein the maximum phase difference detector detects the maximum phase difference, a maximum phase difference between the reference clock signal and the feedback clock signal is determined.

4. The oscillation signal generating circuit according to claim 1, wherein the second circuit further comprises a phase compensation circuit, and the phase compensation circuit is configured to adjust one of the reference clock signal and the feedback clock signal.

5. The oscillation signal generating circuit according to claim 4, wherein the first circuit further comprises a phase frequency detector and a frequency divider, the phase frequency detector is coupled to the voltage-controlled oscillator and is configured to receive the reference clock signal and the feedback clock signal, the frequency divider is coupled between the voltage-controlled oscillator and the phase frequency detector and is configured to output the feedback clock signal, the phase compensation circuit is coupled to the phase frequency detector and the maximum phase difference detector, and when the maximum phase difference detector detects the maximum phase difference, the maximum phase difference detector controls the phase compensation circuit to make a phase of the reference clock signal and a phase of the feedback clock signal tend to be consistent.

6. The oscillation signal generating circuit according to claim 5, wherein the phase compensation circuit is coupled between a reference signal input end and the phase frequency detector, the reference clock signal is from the reference signal input end, and when the maximum phase difference detector detects the maximum phase difference, the phase compensation circuit compensates the phase of the reference clock signal to make the phase of the reference clock signal and the phase of the feedback clock signal tend to be consistent.

7. The oscillation signal generating circuit according to claim 6, wherein the phase compensation circuit determines a phase compensation amount of the reference clock signal by a lookup table.

8. The oscillation signal generating circuit according to claim 5, wherein the phase compensation circuit is coupled between the frequency divider and the phase frequency detector, and when the maximum phase difference detector detects the maximum phase difference, the phase compensation circuit compensates the phase of the feedback clock signal to make the phase of the reference clock signal and the phase of the feedback clock signal tend to be consistent.

9. The oscillation signal generating circuit according to claim 8, wherein the phase compensation circuit determines a phase compensation amount of the feedback clock signal by an interpolation element.

10. The oscillation signal generating circuit according to claim 1, wherein the first circuit further comprises a charge pump, the charge pump is coupled to the voltage-controlled oscillator and is configured to receive a first signal and a second signal, and when the maximum phase difference detector detects the maximum phase difference, voltages of the first signal and the second signal received by the charge pump are both a first voltage.

11. The oscillation signal generating circuit according to claim 1, wherein the first circuit further comprises a phase frequency detector, a frequency divider, a first switching circuit, and a second switching circuit, the phase frequency detector is coupled to the voltage-controlled oscillator, the frequency divider is coupled between the voltage-controlled oscillator and the phase frequency detector, the first switching circuit is coupled to the frequency divider, the phase frequency detector and the maximum phase difference detector, the second switching circuit is coupled to the phase frequency detector and the maximum phase difference detector, and when the maximum phase difference detector detects the maximum phase difference, the maximum phase difference detector controls the first switching circuit and the second switching circuit to make the first switching circuit and the second switching circuit output a direct current signal to the phase frequency detector respectively.

12. The oscillation signal generating circuit according to claim 1, wherein the maximum phase difference detector comprises a digital logic circuit, a time-domain voltage conversion circuit, and a comparator, the digital logic circuit is configured to sequentially record phase differences of at least four time points as a plurality of phase differences, the time-domain voltage conversion circuit is configured to convert the plurality of phase differences into a plurality of voltages respectively, the comparator is configured to compare magnitude relationships of the plurality of voltages, and when magnitude variation trends of the first two of the plurality of voltages is opposite to magnitude variation trends of the latter two of the plurality of voltages, the maximum phase difference detector detecting the maximum phase difference is determined.

13. The oscillation signal generating circuit according to claim 1, wherein the first circuit further comprises a loop filter, the loop filter is coupled to the voltage-controlled oscillator and the voltage compensation circuit, and an input end of the loop filter has the control voltage, the loop filter comprises a resistor and a capacitor, a first end of the resistor is coupled to the input end of the loop filter, a second end of the resistor is coupled to a first end of the capacitor, a second end of the capacitor is coupled to a reference voltage end, the first end of the capacitor has a capacitance voltage, and when the maximum phase difference detector detects the maximum phase difference, the maximum phase difference detector controls the voltage compensation circuit to compensate the capacitance voltage to the target voltage.

14. An oscillation signal generating method, comprising:
- generating an output signal according to a reference clock signal and a feedback clock signal;
- controlling a voltage-controlled oscillator to control a frequency of the output signal according to a control voltage and outputting the output signal;
- detecting a maximum phase difference; and
- compensating the control voltage to a target voltage when the maximum phase difference is detected.

15. The oscillation signal generating method according to claim 14, further comprising:
- determining that the frequency of the output signal initially reaches a target lock frequency when the maximum phase difference is detected.

16. The oscillation signal generating method according to claim 14, further comprising:
- determining a phase compensation amount of the reference clock signal by a lookup table when the maximum phase difference is detected, and compensating a phase of the reference clock signal to make the phase of the reference clock signal and a phase of the feedback clock signal tend to be consistent.

17. The oscillation signal generating method according to claim 14, further comprising:
- determining a phase compensation amount of the feedback clock signal by an interpolation element when the maximum phase difference is detected, and compensating a phase of the feedback clock signal to make a phase of the reference clock signal and the phase of the feedback clock signal tend to be consistent.

18. The oscillation signal generating method according to claim 14, further comprising:
- providing a charge pump to receive a first signal and a second signal; and
- setting voltages of the first signal and the second signal to a first voltage when the maximum phase difference is detected.

19. The oscillation signal generating method according to claim 14, further comprising:
- sequentially recording phase differences at four time points as a plurality of phase differences;
- converting the plurality of phase differences respectively into a plurality of voltages;
- comparing magnitude relationships of the plurality of voltages; and
- determining that the maximum phase difference is detected when magnitude variation trends of the first two of the plurality of voltages is opposite to magnitude variation trends of the latter two of the plurality of voltages.

20. The oscillation signal generating method according to claim 14, further comprising:
- providing a loop filter coupled to the voltage-controlled oscillator; and
- compensating a capacitance voltage at a first end where a capacitor and a resistor are coupled in the loop filter to the target voltage when the maximum phase difference is detected.

* * * * *